(12) United States Patent
See et al.

(10) Patent No.: US 7,317,257 B2
(45) Date of Patent: Jan. 8, 2008

(54) INHIBITING UNDERFILL FLOW USING NANOPARTICLES

(75) Inventors: Chun Hwa See, Penang (MY); Szu Shing Lim, Penang (MY)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 11/304,510

(22) Filed: Dec. 14, 2005

(65) Prior Publication Data

US 2007/0134937 A1    Jun. 14, 2007

(51) Int. Cl.
*H01L 23/48* (2006.01)
*H01L 23/52* (2006.01)
*H01L 29/40* (2006.01)

(52) U.S. Cl. .............. 257/778; 257/777; 257/E21.134; 257/E21.475; 257/E21.511

(58) Field of Classification Search ............... 257/778, 257/659, 660, 678, 777, 749
See application file for complete search history.

(56) References Cited

U.S. PATENT DOCUMENTS

| | | | |
|---|---|---|---|
| 5,843,767 A * | 12/1998 | Beattie | 435/287.1 |
| 6,716,629 B2 * | 4/2004 | Hess et al. | 435/420 |
| 6,803,090 B2 * | 10/2004 | Castiglione et al. | 428/172 |
| 6,866,928 B2 * | 3/2005 | Narum et al. | 428/354 |
| 6,949,176 B2 * | 9/2005 | Vacca et al. | 204/547 |
| 2002/0094533 A1 * | 7/2002 | Hess et al. | 435/6 |
| 2003/0180897 A1 * | 9/2003 | Ulrich et al. | 435/134 |

* cited by examiner

*Primary Examiner*—David Nhu
(74) *Attorney, Agent, or Firm*—Laleh Jalali (57) ABSTRACT

A method and apparatus for inhibiting the flow of a flowable adhesive material disposed adjacent to a substrate. A chip component is disposed adjacent to a substrate and a plurality of nanoparticles are disposed and cured adjacent to the substrate and proximate to the chip component. The nanoparticles possess surface properties that make them substantially immiscible with a flowable adhesive. The band of nanoparticles will inhibit the flow of a flowable adhesive material disposed between the chip and the nanoparticles, in a direction bounded by the plurality of nanoparticles, while adhesive flow in the direction of the component is promoted.

17 Claims, 7 Drawing Sheets

INHIBITING UNDERFILL FLOW USING NANOPARTICLES

FIELD OF THE INVENTION

The present invention relates generally to the field of semiconductor device manufacturing. In particular, the present invention relates to a method and apparatus for selectively inhibiting underfill flow during semiconductor device assembly.

BACKGROUND OF THE INVENTION

Chip components joined to substrates are subject to crack formation along the bond lines between attachment structures (such as bumps) and the component, or between attachment structures and the substrate to which a chip component is attached. Cracks may occur in manufacturing or use when the materials comprising a component and its associated packaging materials expand and contract at different rates during thermal variation due to different coefficients of thermal expansion (CTE). Such cracks are a major source of device failure in chip components. Underfill techniques and materials are extensively used in semiconductor manufacturing to stabilize chip components and help prevent device failure.

While several types of underfill technologies are known, one of the most commonly used is 'capillary underfill'. Capillary underfill typically comprises a flowable adhesive material dispensed adjacent to a substrate, proximate to an edge of a chip component so that the flowable adhesive contacts the component and the substrate, and is drawn into and through an intervening gap by a wicking action. When functioning properly, the underfill will migrate completely beneath the component, displacing all air and reaching to other edges of the chip component. The underfill may then be cured, whereby the underfill forms a substantially rigid material surrounding and strengthening each attachment joint, enabling the materials to better withstand the stresses applied to attachment structure bond lines during thermal variation. At each edge of the component, a generally concave fillet of underfill material may form, extending from the component to the substrate surface only a short distance beyond the peripheral boundary of the component.

After dispense, a flowable adhesive may flow not only into and through the gap between the component and the substrate, but also tends to flow away from the dispense point and the component, across the surface of the substrate. Once cured, this 'counter-directional' flow forms an 'extended fillet' of underfill material. This generally unimpeded flow away from the component necessitates, in many instances, the use of more underfill than is necessary to simply fill the component-substrate gap, and the underfill material comprising the extended fillet is essentially wasted, as it serves no substantially beneficial purpose. Further, the area covered by the extended fillet is generally designated a 'keep out zone' into which no other components are placed. Therefore, on the side of a chip component where an extended fillet of underfill material forms, the substrate surface area beneath the extended fillet is made unavailable for component placement, and is also essentially wasted.

Substrates, for example, printed circuit boards (PCB) used in computer motherboards, are typically designed and manufactured for extremely dense component placement, necessitated by the increasing performance demands of such devices, and also by the increasing market pressure to reduce the overall physical size of electronic devices. Therefore, consuming substrate surface area with an extended fillet of underfill, and therefore making that surface area off limits to component placement, complicates the already difficult device design challenges. Further complicating matters are the ever rising demands on device performance and tighter power regulation requirements, which sometimes result in placing certain power regulation components (for example, capacitors) in close proximity to processing components, including some chip components. Again, an extended fillet of underfill material may frustrate the design goal of placing components close to a chip component on the surface area otherwise covered by an extended fillet, thereby frustrating attempts to meet device power regulation objectives.

DETAILED DESCRIPTION OF THE INVENTION

Figure 1:
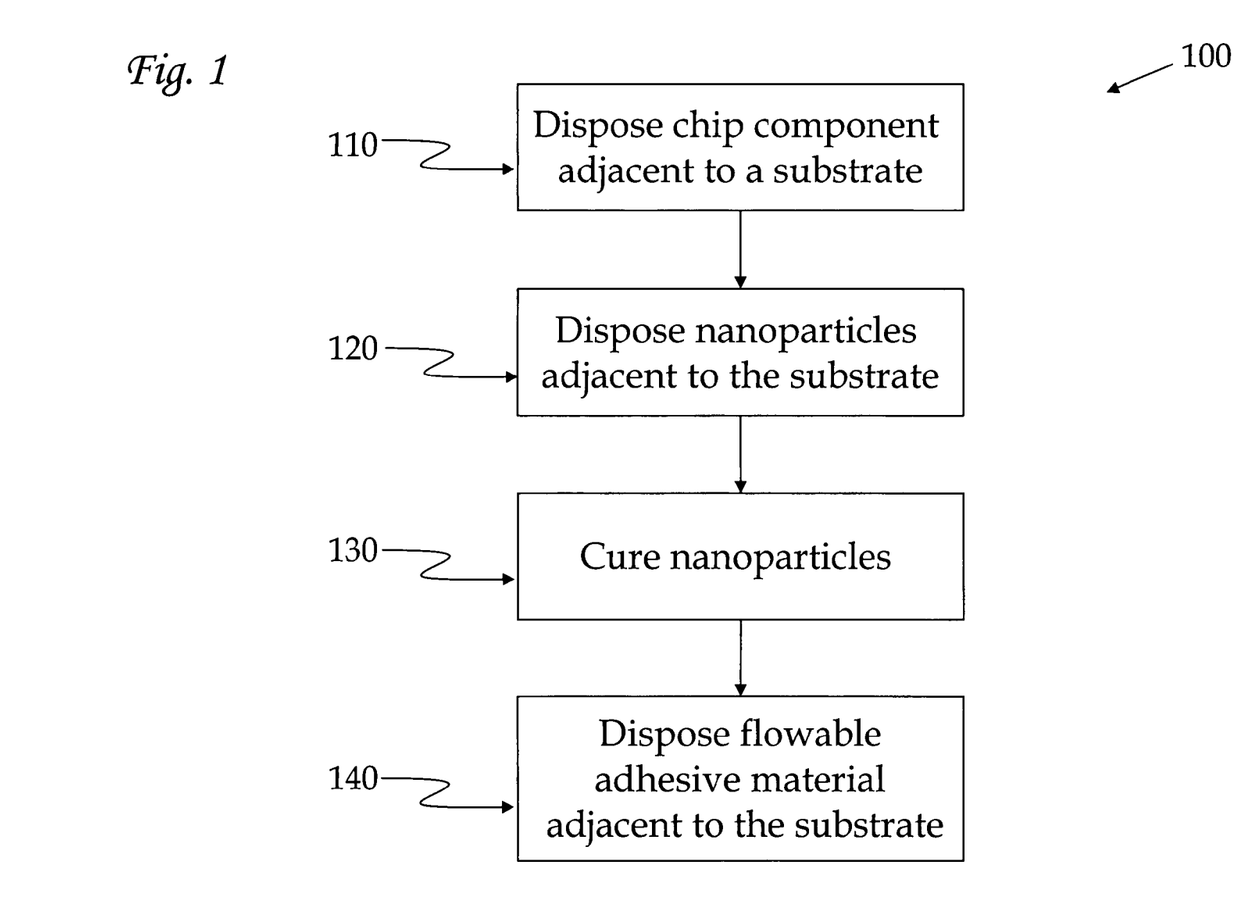
FIG. 1 depicts a block diagram of a method of inhibiting undesirable underfill flow according to an embodiment of the invention.

In an embodiment 100 of a method for inhibiting underfill flow using nanoparticles, as depicted in FIG. 1, a chip component ("chip") is disposed adjacent to a substrate, at 110. Disposing a chip may include, according to an exemplary embodiment, placing a chip so that each attachment structure ('bump') in an array of bumps is aligned with a corresponding bonding point ('bond pad') on the surface of a substrate, and causing each bump so placed to become physically coupled with its corresponding bond pad.

Figure 2:
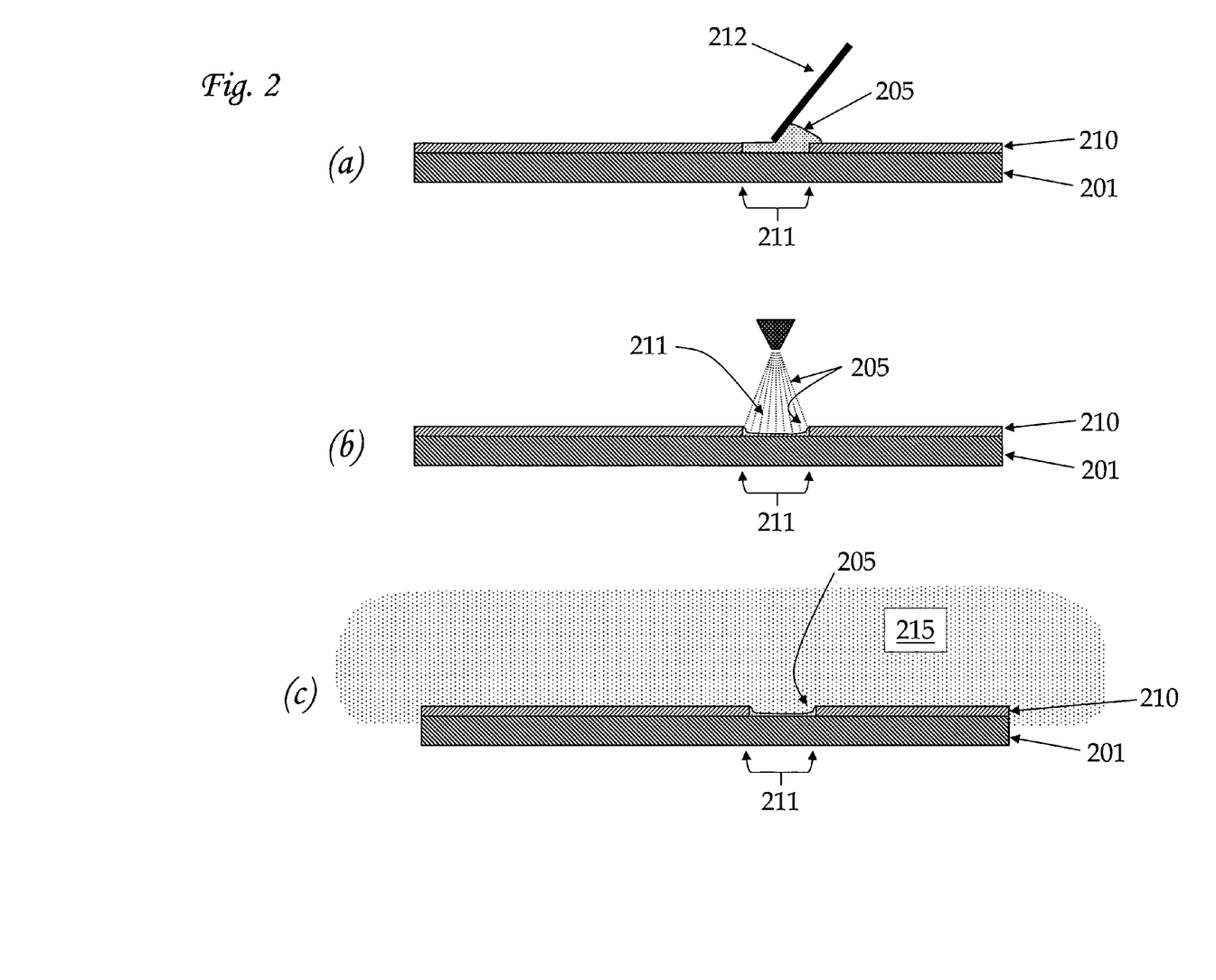
FIGS. 2a-2c depict methods for disposing nanoparticles adjacent to a substrate according to embodiments of the invention.

At step 120, nanoparticles are disposed adjacent to the substrate. Nanoparticles may be disposed by any number of different methods, with reference to FIGS. 2a-2c. As shown in FIG. 2a, nanoparticles 205 are disposed adjacent to a substrate 201 by placing a masking apparatus (mask) 210 adjacent to a substrate surface, the mask 210 having at least one opening 211 aligned with a location on the substrate 201 where the plurality of nanoparticles 205 are to be disposed, and drawing the nanoparticles 205 across the surface of the mask 210 with a spreading or leveling device 212 (e.g., 'squee-gee') so that a subset of the nanoparticles 205 are retained adjacent to the substrate 201 in the opening 211.

Nanoparticles 205 that are not retained in the opening 211 may be removed from the mask 210 and substrate 201 by the leveling device 212, or may remain on the mask 210 to be removed when the mask 210 is removed. By this method, the thickness (z axis dimension) of the retained nanoparticles corresponds to the thickness of the mask 210, and the length, width, and shape (x and y axis dimensions) of the retained nanoparticles correspond to the length, width, and shape of the opening 211, 50 that when the mask is removed, a structure remains on the surface of the substrate 201, the structure including the nanoparticles retained in the x, y, and z dimensions as described above. The method described above and shown in FIG. 2a may be generally called 'masking'.

Nanoparticles 205 may also be disposed adjacent to a substrate 201 by a method similar to that described above, except that the nanoparticles are sprayed onto the surface of a substrate 201 through an opening 211 in a mask 210, as depicted in FIG. 2b, or deposited through an opening 211 in a mask 210 by vapor deposition of a vapor 215 including nanoparticles, as depicted in FIG. 2c, or by a similar method. Using these methods, a plurality of nanoparticles 205 collect and are retained adjacent to the surface of a substrate 201 within the opening of the mask 210, remain adjacent to the surface of the substrate 201, and generally retain the x, y, and z dimensions of the opening 211 even when the mask 210 is removed.

In yet another embodiment, a layer or plurality of layers of nanoparticles may be disposed adjacent to the surface of a substrate, the nanoparticles covering the entire substrate surface, or covering only a portion of the surface of the substrate, but in either case, covering more of the substrate surface than that corresponding to a finally formed nanoparticle structure. Next, nanoparticles corresponding in location and dimensions to the intended final nanoparticle structure are exposed to a radiation source, 'curing' the nanoparticles so exposed and causing them to become fixed adhesively to the surface of the substrate, and fixed cohesively to each other. Radiation sources that may be used to cure nanoparticles include laser, heat, ultraviolet (UV), or others. A mask may also be used between the radiation source and the nanoparticles to prevent radiation from exposing and curing nanoparticles corresponding to locations on the surface of the substrate other than where a nanoparticle structure is to be formed. Finally, all nanoparticles not cured are removed from the surface of the substrate by, for example, rinsing the surface of the substrate with a solvent or with a substance having the properties of a surfactant.

The methods for disposing nanoparticles described herein are exemplary embodiments, and not an exclusive list, as other methods are also contemplated, including, laminating a film of nanoparticles adjacent to a substrate, painting nanoparticles onto the surface of a substrate with a brush or similarly suitable device, dispensing them from a nozzle as a semi-viscous solution, or others as may be adapted from the lithographic, adhesive, painting, or other arts.

In an exemplary embodiment, nanoparticles may be disposed adjacent to a substrate in multiple layers so that the layers form a nanoparticle structure on the surface of the substrate. As will be described, nanoparticles so disposed may have a tendency to inhibit the flow of a flowable adhesive, thereby acting as a boundary feature or structure. Nanoparticles so disposed may have dimensions that resemble a band (e.g., strip, ribbon), and may be referred to as 'a nanoparticle band'. In other embodiments, the general shape of the nanoparticles when disposed adjacent a substrate surface may resemble a geometric shape, or may be relatively amorphous (non-geometric). In other embodiments, a portion of the periphery of the nanoparticles may correspond in shape to an edge of a nearby component, while another portion of the periphery of the disposed nanoparticles may correspond in shape to that of another nearby component, or may be relatively amorphous, or may have some shape other than those listed here.

Nanoparticles typically are disposed proximate to a location at which a chip is or will be disposed adjacent to the substrate. The distance between a chip and disposed nanoparticles may vary based on the dimensions of the nanoparticle band, the dimensions of the chip, and the composition, viscosity, and amount of flowable adhesive to be used. Conditions that may affect the flow rate of a flowable adhesive include the topography, material, and temperature of the substrate surface, the ambient temperature, humidity and atmospheric pressure, and numerous other factors as would be appreciated by one skilled in the art. Given these many conditions, it is neither practical nor necessary to provide herein the exact distance of separation between a chip and a nanoparticle band in each instance. The appropriate distance may be determined without undue experimentation, in light of this specification, by one possessing ordinary skill in the art.

Figure 3:
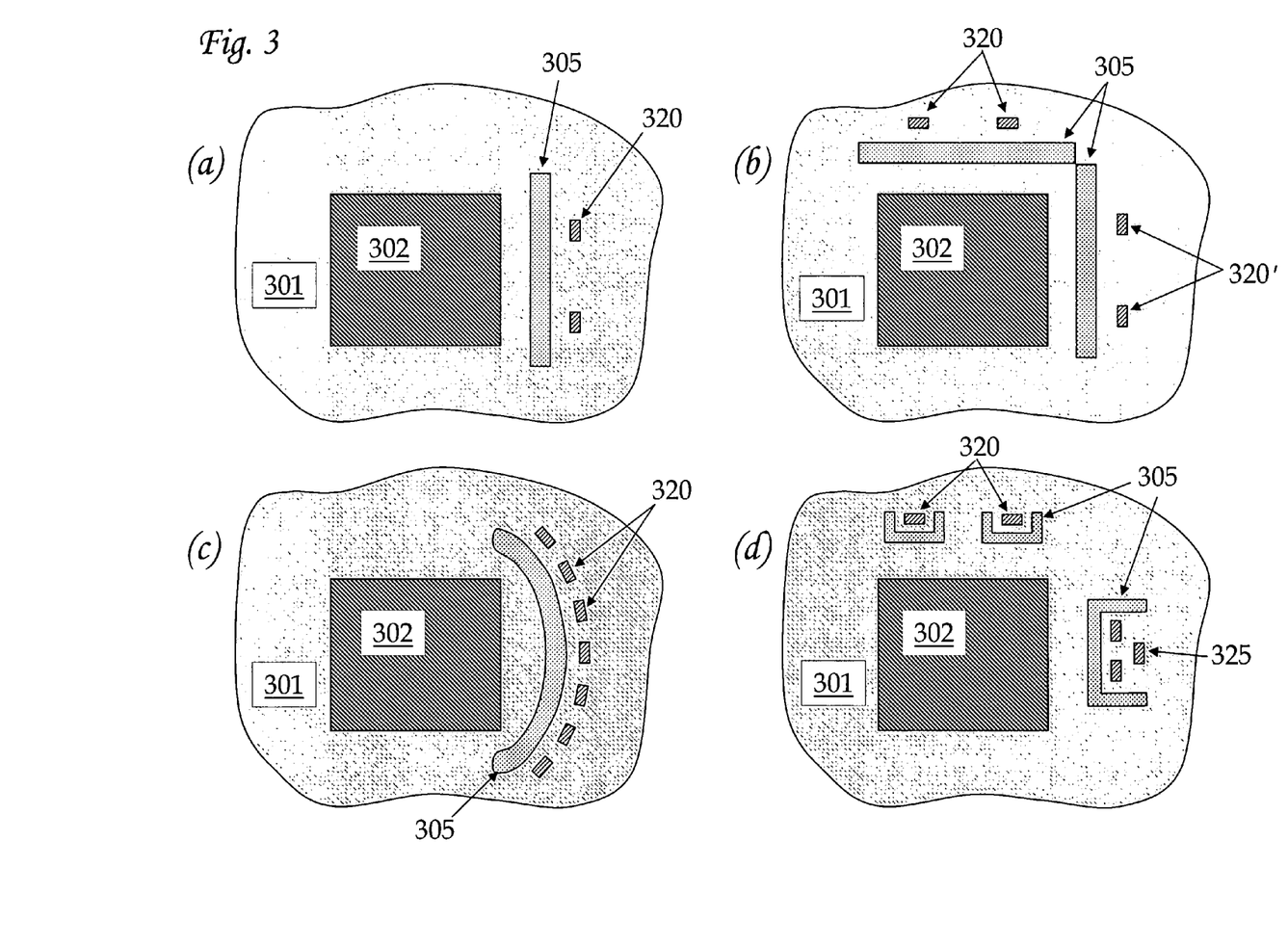
FIGS. 3a-3f depict underfill flow inhibiting structures disposed proximate to a component according to embodiments of the invention.

As seen in FIGS. 3a-3f, one or more nanoparticle bands may be formed in a variety of shapes, according to numerous embodiments. For example, as shown in FIG. 3a, a single nanoparticle band 305 is formed adjacent to a substrate 301 and proximate to one side of a chip 302. The nanoparticle band 305 forms a generally rectangular structure defining a boundary between the chip 302 and one or more components 320 or plurality of components also disposed adjacent to the substrate 301, however, as noted, other shapes of nanoparticle bands are used in other embodiments. Likewise, other embodiments may be substantially similar to that shown in FIG. 3a, but employ two or more nanoparticle bands of equal length, or of different lengths as shown in FIG. 3e, or in which the nanoparticle bands are relatively shorter than shown in FIG. 3a, but are disposed so that their ends overlap by some amount as shown in FIG. 3f.

As depicted in FIG. 3b, two of nanoparticle bands 305 may also be disposed proximate to corresponding sides of the chip 302, each nanoparticle band 305 likewise forming a boundary between a corresponding side of the chip 302 and one or more components 320, 320' adjacent to the substrate 301 and proximate to each nanoparticle band 305. Each nanoparticle band 305 may possess the same dimensions as each other nanoparticle band so disposed, or in various embodiments, at least one of nanoparticle band may differ in at least one dimension, or differ in shape, from another nanoparticle band so disposed.

As may be understood, embodiments according to FIG. 3a-3b are not limited to the two nanoparticle bands 305 disposed proximate to corresponding adjacent sides of a chip 302. Therefore, according to alternative embodiments, nanoparticle bands 305 may be disposed proximate to every side of a chip 302, disposed separated from each other, as shown in FIG. 3b, or intersect and overlap to varying degrees. Thereby, a contiguous boundary of nanoparticle bands 305, or a single nanoparticle band, may be disposed adjacent to the substrate surface so as to surround entirely, or almost entirely, the periphery of a chip 302.

FIG. 3c shows another embodiment whereby a nanoparticle band 305 is disposed adjacent to a substrate. As shown, a nanoparticle band 305 disposed in a curvilinear shape, or 'arc', proximate to a side of a chip 302, forms a boundary between the chip 302 and other components 320 disposed adjacent to the substrate 301. As is known in the art, electrical pathways on or buried beneath the surface of a substrate 301 may be routed outward form a chip 302 according to a fan shaped or radial 'breakout pattern', particularly when the chip possesses a large number of bumps as terminals electrically coupled to the substrate 301 through the bump array. It may, in some instances, be advantageous to place components 320 along the electrical pathways to affect signals or electrical currents conveyed along the pathways. Additionally, it may be advantageous to dispose components 320 adjacent to the substrate in a curvilinear pattern corresponding to the radial configuration of the breakout pattern. Therefore, in such embodiments, one or more curvilinear nanoparticle bands 305 are useful to create a boundary conforming to a curvilinear pattern of component 320 placement. As previously discussed regarding FIG. 3b, a curvilinear nanoparticle band 305 according to FIG. 3c also may not only be disposed proximate to a single side of a chip, but may also continue in a curvilinear configuration proximate to more than one side of the chip 302, or may entirely surround the periphery of the component 302. In other embodiments, a nanoparticle band 305 may be curvilinear on one or more sides of a chip 302, and also may be linear or some other configuration on one or more other sides of the chip 302.

In another embodiment, as shown in FIG. 3d, one or more nanoparticle bands 305 is disposed adjacent to the substrate 302 and proximate to one or more sides of a chip 302, each nanoparticle band 305 forming a conformal boundary between a single component 320 or a discrete grouping of components 325 and the chip 302. A nanoparticle band 305 disposed according to FIG. 3d may conform to one or more sides of a component 320 or discrete grouping of components 325, or may surround the entire periphery of the component 320 or discrete grouping of components 325.

Embodiments are also envisioned wherein any combination of nanoparticle bands 305 may be simultaneously employed proximate to one or more chips disposed adjacent to a substrate. Therefore, the embodiments shown in FIGS. 3a-3f should not be construed to limit the configurations, combinations, or arrangements of a nanoparticle band or plurality of nanoparticle bands disposed adjacent to a substrate and proximate to a chip, nor to comprise an exclusive listing of such embodiments.

In FIG. 1 at 130, nanoparticles may be cured by exposure to a source of radiation. Curing may be accomplished in separate embodiments using any of a number of different sources of radiation, either alone or in combination, including any of those discussed above. As stated, cured nanoparticles may be adhesively fixed to the surface of a substrate, and cohesively fixed to adjacent nanoparticles so that a durable nanoparticle band is formed adjacent to the surface of a substrate.

With reference again to FIG. 1, after both a chip and one or more nanoparticle bands are disposed adjacent to a substrate, a flowable adhesive material is disposed adjacent to the substrate, at 140, in a location between and proximate to both the component and the nanoparticle band(s). In an exemplary embodiment, a flowable adhesive encapsulates the bumps of the bump array, adheres a chip to the surface of a substrate, and helps prevent cracking at the bond lines of the bumps by stabilizing the bump array against the stresses imparted by differing coefficients of thermal expansion (CTE) of materials during thermal variation. In embodiments where a flowable adhesive is disposed adjacent to a substrate and proximate to a chip, with the expectation or intention that the flowable adhesive may flow between the chip, the substrate surface, and among the bumps of a bump array, the flowable adhesive may be referred to as 'underfill material', or simply 'underfill'.

Figure 4:
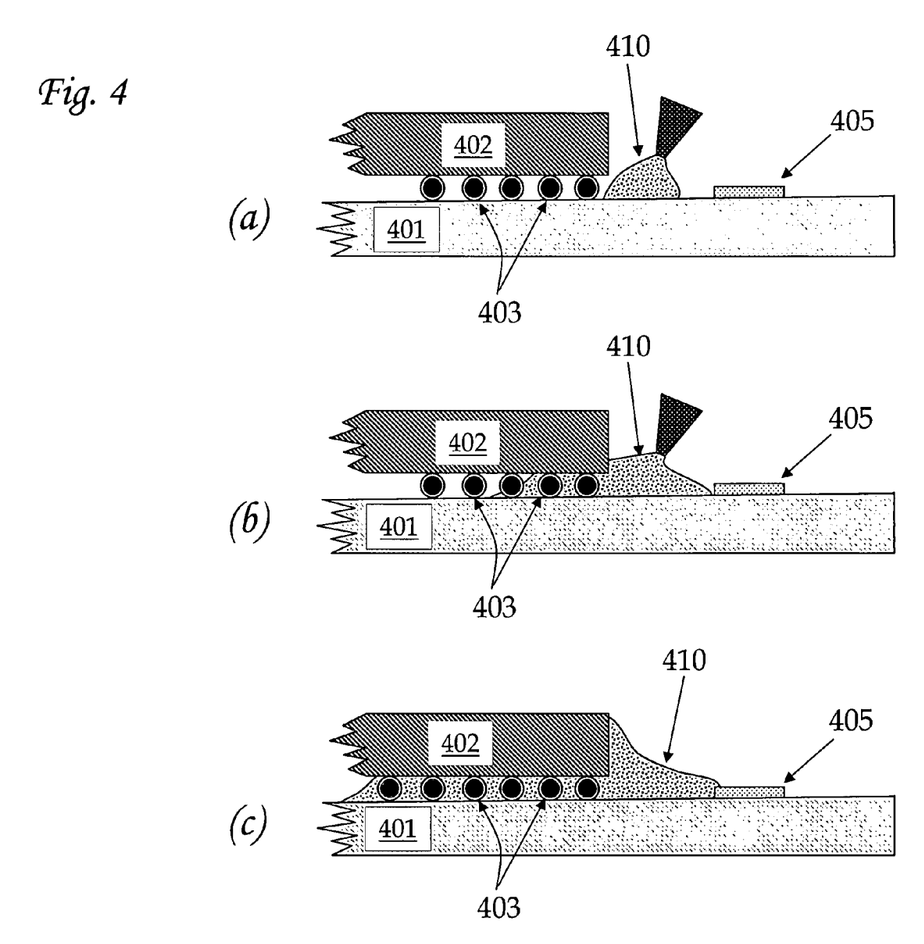
FIGS. 4a-4c depict the flow progress of an underfill, disposed between a component and a flow inhibiting structure, comprised of nanoparticles according to embodiments of the invention.

As shown in FIG. 4a, an underfill 410 may be disposed adjacent to a substrate 401 between and proximate to a nanoparticle band 405 and a chip 402. The underfill 410 so disposed may begin to flow at a substantially uniform rate in all directions simultaneously. However, when a flow front of the underfill material 410 contacts the chip 402 disposed so that a gap exists between the chip 402 and the substrate 401, the underfill material 410 will tend to be pulled into and through the gap by a wicking action. The physical phenomenon of the wicking action is well known in the art, thus, it is not necessary to describe it in great detail here. However, it is relevant to mention that a number of factors may limit the rate at which wicking causes the underfill material 410 to migrate beneath a chip 402. Thus, throughout the duration of time necessary for an underfill material 410 to flow from the side of a chip 402 proximate to where the underfill material 410 is disposed, throughout the entire bump array 403, to each other side of the chip, the underfill material 410 will also tend to flow in other directions away from the chip 402. FIG. 4b shows this phenomenon.

In FIG. 4b, the underfill material 410 is shown migrating beneath the chip 410, while simultaneously flowing toward the nanoparticle band 405. As the rate of flow of the underfill material 410 beneath the chip 402 may be influenced by different and more numerous factors than the rate of flow toward the nanoparticle band 405, these two rates may not be equal. Therefore, the underfill material 410 flow front may reach the nanoparticle band 405 before it fills the gap beneath the chip 402 and reaches the other sides of the chip 402, as shown in FIG. 4c. Because the nanoparticle band 405 is substantially immiscible (non-wettable, or non-wetting) with the underfill material 410, once the flow front of the underfill material 410 contacts the nanoparticle band 405, the flow rate of the underfill material 410 should be inhibited in the direction of the nanoparticle band 405. As noted, the nanoparticle band is substantially, but in embodiments not completely, immiscible with the underfill material, which means that a small amount of underfill material may penetrate into the matrix of cured nanoparticles in the nanoparticle band by a wicking action. However, several features of the nanoparticle band 405 and of the nanoparticles forming the band help to inhibit the flow of the underfill material 410.

Figure 5:
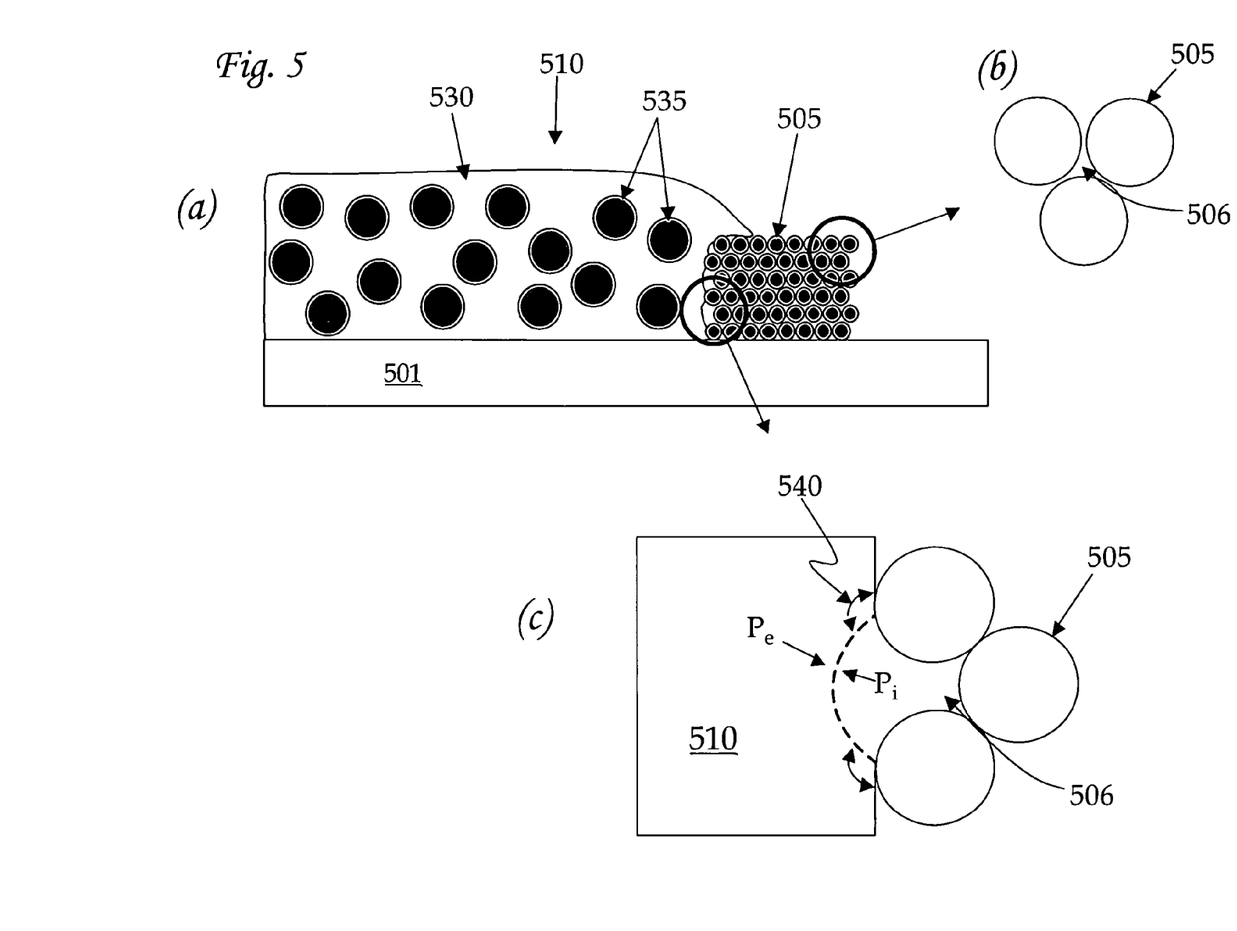
FIG. 5a depicts an underfill material and a flow inhibiting structure comprising nanoparticles, including the relative sizes of filler particles in the underfill material and of nanoparticles according to an embodiment of the invention.
FIG. 5b depicts a nanopore among nanoparticles according to an embodiment of the invention
FIG. 5c depicts an underfill material contacting a nanoparticle structure, according to an embodiment of the invention

First, with reference to FIG. 5a, uncured underfill material 510 generally consists of monomers of epoxy resin 530 and filler particles 535. Nanoparticles 505 in the nanoparticle band form a relatively dense matrix when cured, and generally are chosen so as to be smaller in size than the filler particles 535 of the underfill material 510. Therefore, filler particles 535 in the underfill material 510 are excluded from penetrating into the matrix of the nanoparticle band.

Second, the nanoparticles 505 themselves may include surface chemistry which gives them the characteristic of being immiscible with the underfill material 510. In various embodiments, the nanoparticles 505 are formed of silicone or a fluorocarbon material. In other embodiments, the nanoparticles 505 are formed of a ceramic material, such as an oxide or a nitride, however, the surface of the ceramic nanoparticles may be treated to form branch tails of silicone, fluorocarbon materials, or other immiscible materials. In embodiments, nanoparticles 505 are used in a nanoparticle band including any combination of silicone nanoparticles, fluorocarbon nanoparticles, and oxide or nitride ceramic nanoparticles with their surfaces treated as described above.

As the epoxy resins 530 in many commonly used underfill materials typically include a hydrocarbon base, which is immiscible with silicone or fluorocarbon materials, the underfill material 510 is repelled by the nanoparticles 505 of the nanoparticle band. Underfill materials not containing epoxy resigns are used in other embodiments in conjunction with nanoparticles that are immiscible with those materials.

Third, as shown in FIG. 5b, a nanoparticle matrix of a cured nanoparticle band also includes nanopores 506, very small airspaces formed within the matrix between the nanoparticles 505. Such airspaces may also be present at the side of the nanoparticle band contacted by a flow front of the underfill material. Referring to FIG. 5c, the pressure across the air-epoxy interface is determined by the air pressure ($P_i$) inside the nanopores 506 and the pressure ($P_e$) of the underfill material 510, which in turn determines the curvature of the air-epoxy interface and the contact angle of the underfill material 510 at the periphery of the air-epoxy interface. A large contact angle 540, such as greater than 90 degrees in an exemplary embodiment, helps slow the rate of capillary flow of underfill material 510 into and through the nanoparticle 505 matrix. Therefore, such factors as the size of the nanopores 506, the surface chemistry of the nanoparticles 505, and the composition and condition of the underfill material 510 itself influence the size of the contact angle 540, and help to inhibit the flow of an underfill material 510.

Because a nanoparticle band disposed adjacent to a substrate may overlie electrically conductive pathways formed at the surface of the substrate, a nanoparticle band may be formed primarily or entirely of electrically insulative materials to prevent electrical short circuiting between the pathways.

When no nanoparticle band is present, an extended fillet of underfill material may form proximate to a chip on a side where the underfill material is disposed adjacent to a substrate. However, when underfill material is disposed adjacent to a substrate between and proximate to a chip and a nanoparticle band according to embodiments of the invention, the nanoparticle band inhibits the flow of the underfill material sufficiently for it to completely underfill the chip, forming fillets on each side of the chip, before the underfill may flow out of a reduced component keepout zone surrounding the chip. Therefore, components may be placed closer to the chip when a nanoparticle band is disposed adjacent to a substrate than when no nanoparticle band is present.

It should be understood that the width ('width' describing a distance across a nanoparticle band from a side proximate to the chip to a side distal from the chip) and thickness ('z' axis dimension) of a nanoparticle band may vary, and that the ability of a nanoparticle band to sufficiently inhibit the flow of an underfill material is at least partially related to its width and thickness. The distance by which a nanoparticle band is separated from a chip also influences the width for an effective nanoparticle band. For example, in an exemplary embodiment wherein a nanoparticle band is disposed closely to a substrate, sufficient underfill flow inhibition is achieved with a relatively wider or thicker nanoparticle band. Conversely, a nanoparticle band disposed farther from a chip provides sufficient underfill flow inhibition although the nanoparticle band may be relatively thin or narrow. In an embodiment including a larger chip, necessitating a larger amount of disposed underfill material, a relatively wider or thicker nanoparticle band provides adequate underfill flow inhibition whereas the underfill may overflow a relatively narrower or thinner nanoparticle band. While in some embodiments, the above described variables of distance between a chip and a nanoparticle band and the width of a nanoparticle band are inversely correlated, in other embodiments, any such correlation may be reduced nearly to insignificance. Thereby, in embodiments, it is possible to employ a very thin nanoparticle band although it is disposed quite closely to a chip. In other embodiments, a relatively thick or wide nanoparticle band is employed although it is disposed quite relatively distant from the chip. Factors earlier mentioned as affecting the flow speed of a flowable adhesive (e.g., underfill) may also affect the flow inhibiting capabilities of a nanoparticle band of a particular width or distance from a chip component.

As mentioned above, due to the large number of variables involved, it is not practical to attempt to describe the optimal or acceptable dimensions for a nanoparticle band, nor the optimal or acceptable distance to dispose a nanoparticle band from a chip, in each conceivable combination of variables. However, such dimensions may be determined without undue experimentation, in light of this specification, by one possessing ordinary skill in the art.

Figures 6A, 6B:
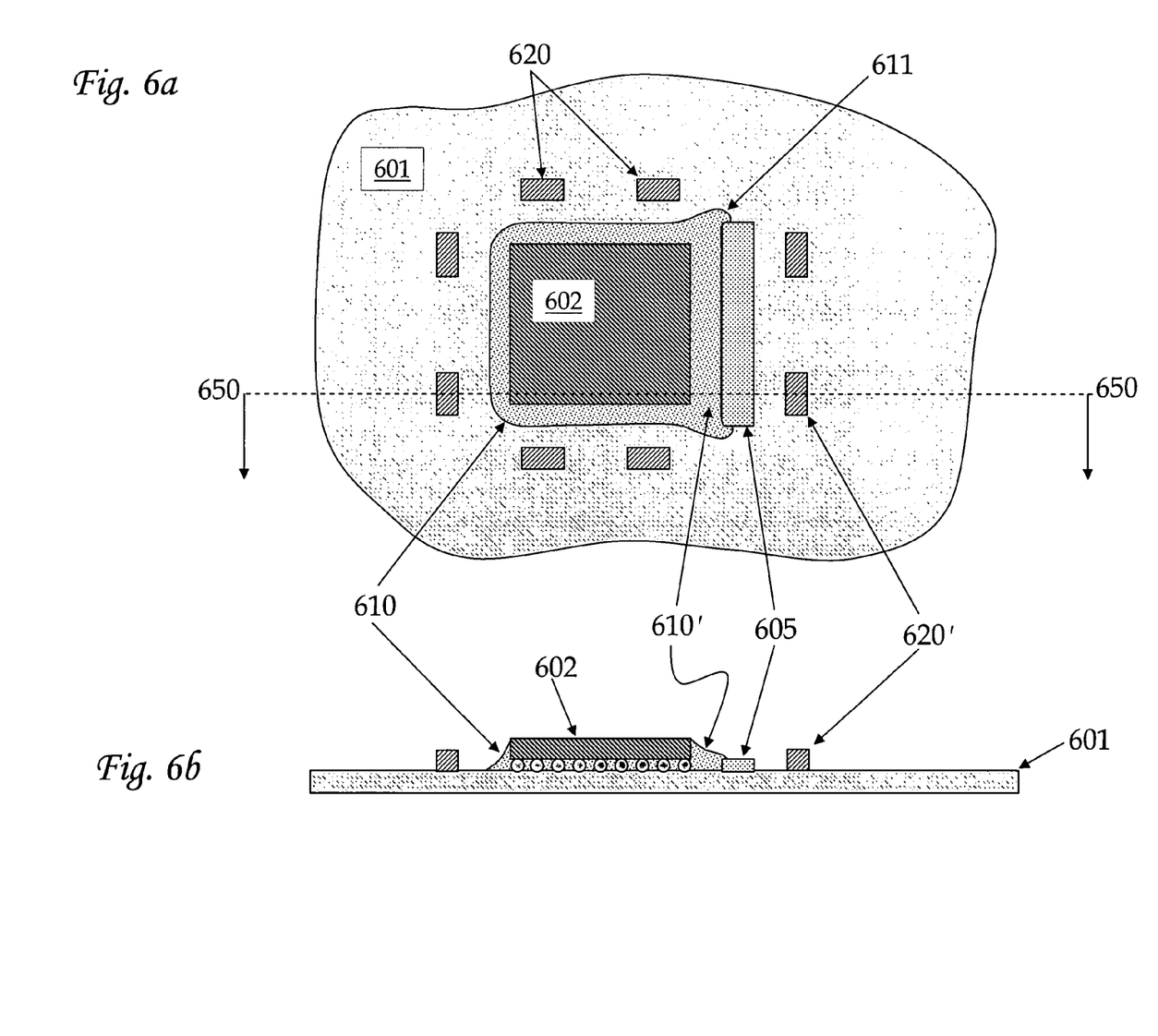
FIG. 6a depicts a top view of an assembly according to an embodiment of the invention.
FIG. 6b depicts a cross-sectional view of an assembly according to an embodiment of the invention.

FIGS. 6a-b depict an embodiment of an assembly including a chip 602 disposed adjacent to a substrate 601. FIG. 6a depicts a top view of an embodiment, while FIG. 6b depicts a cross-sectional view of the same embodiment though the line 650-650'. Proximate to one side of the chip 602, a nanoparticle band 605 is also disposed adjacent to the substrate 601. An underfill material disposed adjacent the substrate 601 between and proximate to the chip 602 and the nanoparticle band 605 forms a fillet 610 around all sides of the chip 602, and is slightly extended at 610' where it was disposed. The slightly extended fillet extends from the side of the chip 602 to, and in some embodiments, partially overlapping the nanoparticle band 605. In some embodiments, a small amount of the underfill material 611 may flow partially beyond the side of the nanoparticle band 605, bypassing a boundary formed by the proximate side of the nanoparticle band 605. However, in embodiments, such 'bypass flow' may be reduced or prevented entirely by forming a longer nanoparticle band 605 or by disposing a smaller quantity of underfill material.

FIGS. 6a-6b depict an embodiment of an assembly including a chip 602 disposed adjacent to a substrate 601. FIG. 6a depicts a top view of an embodiment, while FIG. 6b depicts a cross-sectional view of the same embodiment though the line 650-650'. Proximate to one side of the chip 602, a nanoparticle band 605 is also disposed adjacent to the substrate 601. An underfill material disposed adjacent the substrate 601 between and proximate to the chip 602 and the nanoparticle band 605 forms a fillet 610 around all sides of the chip 602, and is slightly extended at 610' where it was disposed. The slightly extended fillet extends from the side of the chip 602 to, and in some embodiments, partially overlapping the nanoparticle band 605. In some embodiments, a small amount of the underfill material 611 may flow partially beyond the side of the nanoparticle band 605, bypassing a boundary formed by the proximate side of the nanoparticle band 605. However, in embodiments, such 'bypass flow' may be reduced or prevented entirely by forming a longer nanoparticle band 605 or by disposing a smaller quantity of underfill material.

Components 620, 620' are disposed adjacent to the substrate 601 proximate to the sides of the chip 602. Components 620' are disposed proximate to a side of the nanoparticle band 605 opposite from the chip 602. In the embodiment depicted in FIGS. 6a-6b, the flow of the underfill material 610' in the direction of the nanoparticle band 605 is inhibited by the nanoparticle band 605 so that it does not form an extended fillet beyond the nanoparticle band 605. Therefore, in the depicted embodiment, the components 620' are disposed adjacent to the substrate relatively closely to the chip 602 without being contacted by the flowing underfill material. Accordingly, a component 'keep-out zone' proximate to the chip 602, into which components 620' may not be disposed, extends only a short distance away from the chip 602 in embodiments of the invention, rather than a substantially longer distance away from the chip 602 when a nanoparticle band 605 is not disposed adjacent to the substrate 601 as in the prior art. Therefore, because the keep-out zone is reduced in embodiments of the invention, components 620' may be disposed more closely to a chip. Additional benefits that may be realized in embodiments include improvements power regulation, in signal conveyance and signal processing, an increase in the number of components that may be disposed adjacent to a substrate, overall substrate size reduction, reduction in the amount of underfill material used, and others as may be appreciated by those possessing skill in the art.

In an exemplary embodiment, the chip component is a flip chip component, however, in other embodiments, the chip may comprise a controlled collapse chip connect device (C4), single chip packaged component, or multiple chip packaged components provided in configurations other than flip chip, as are known in the art. A chip component may include a processing device, a memory device, and input/output (I/O) device, a graphics or audio device (such as audio codec), a chipset device, a controller device, an optoelectronic device, a network communications device, or other such devices as are known in the art. However, in a broad sense, a chip is a semiconductor component which includes or is designed to include an array of interconnect structures (e.g., bumps) disposed in a grid-like or similar pattern adjacent to a surface of the component or a package feature of the semiconductor component.

In exemplary embodiments, a substrate, as depicted at 201, may include a PCB implemented as a package substrate, or as a motherboard (e.g., 'mainboard'). Substrates including package substrates and motherboards according to embodiments comprise portions of a mobile computer, a desktop computer, a server, a mainframe computer, or other computing devices, analytical equipment, robotic or other manufacturing equipment, automotive or other transportation equipment, military or law enforcement equipment (e.g., for surveillance, targeting, guidance, detection) or other industrial equipment reliant upon electronic signal processing or power regulation. However, numerous other embodiments of a substrate may also include a printed circuit board implemented as a memory card, a communication card, an (I/O) card, an audio/graphics card, a network interface card, a processor card, or others as are known in the art. Embodiments of a substrate may also include a PCB implemented in a portable device such as a mobile phone, a handheld computing device (e.g., a personal digital assistant (PDA) or a palmtop computer), an inventory tracking device, an environmental monitoring device, an electrical testing device, or others as are known in the art. An embodiment of a substrate may include a flexible ('flex') substrate. In the broadest sense, a substrate according to embodiments of the invention may include any substrate possessing a surface to which at least a subset of an interconnect array of a chip may be physically coupled.

An assembly, such as an embodiment of the invention depicted in FIGS. 6a-6b, may form a portion of an electrical device including a substrate. These may include computing devices (including stationary and mobile computers, servers, palmtop' computers, etc.), communication devices (e.g., mobile phones, pagers, text messaging devices, radio transceivers), entertainment devices (e.g., audio, video, gaming), analytical and monitoring devices (e.g., medical, industrial, research), vehicle operation and safety systems (e.g., automotive, aerospace, maritime, military), network devices (e.g., switches, routers, hubs), industrial/manufacturing (e.g., robotic, assembly, inspection, repair, power generation and management), and others. However, this list of devices and categories of devices is not exhaustive, and should not be construed as excluding any other electrical devices wherein a chip component according to embodiments of the invention may be included.

Although FIG. 1 depicts an embodiment of the invention, FIG. 1 should not be construed as limiting the order of the operations as described at 110-140. In alternate embodiments, a chip may be disposed adjacent to a substrate prior to disposing nanoparticles, or nanoparticles may be disposed adjacent to a substrate prior to disposing a chip, or both may be disposed simultaneously. Likewise, in embodiments wherein nanoparticles are disposed adjacent to a substrate prior to disposing a chip, nanoparticles may be cured either before or after disposing the chip.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

We claim:

1. An apparatus, comprising:
a substrate;
a component disposed adjacent to the substrate;
a plurality of nanoparticles disposed adjacent to the substrate and proximate to at least a first side of the component;
the nanoparticles each having an outer surface, the outer surface having a characteristic of being substantially immiscible with a flowable adhesive material.

2. The apparatus of claim 1, wherein the nanoparticles comprise at least one of silicone and fluorocarbon.

3. The apparatus of claim 1, wherein the nanoparticles comprise ceramic nanoparticles, the outer surface of the nanoparticles including at least one of silicone branch tails or fluorocarbon branch tails.

4. The apparatus of claim 1, wherein the plurality of nanoparticles is disposed in a plurality of layers.

5. The apparatus of claim 1, wherein the component comprises at least one of a flip chip component or a controlled collapse chip connect (C4) component.

6. The apparatus of claim 1, wherein the plurality of nanoparticles further comprises nanopores.

7. The apparatus of claim 1, wherein the nanoparticles are smaller than filler particles in the flowable adhesive material.

8. The apparatus of claim 1, wherein the plurality of nanoparticles inhibit the flow of the flowable adhesive material in a direction bounded by the nanoparticles.

9. An assembly, comprising:
a substrate;
a chip component disposed adjacent to the substrate;
a plurality of nanoparticles disposed adjacent to the substrate and proximate to at least a first side of the chip component, the nanoparticles each having an outer surface, the outer surface of the nanoparticles having a characteristic of being substantially immiscible with a flowable adhesive material;

another component disposed adjacent to the substrate proximate to a side of the nanoparticles opposite the chip component, the nanoparticles forming a boundary between the chip component and the other component; and a flowable adhesive disposed adjacent to the substrate and between the chip component and the nanoparticles.

10. The assembly of claim 9, wherein the plurality of nanoparticles are disposed as a plurality of layers.

11. The assembly of claim 9, wherein the plurality of nanoparticles comprise a boundary feature capable of substantially inhibiting the flow of the flowable adhesive material in at least a direction bounded by the plurality of nanoparticles.

12. The assembly of claim 9, wherein the substrate, the chip component, the other component and the plurality of nanoparticles comprise a portion of an electrical device.

13. The assembly of claim 9, wherein the nanoparticles comprise a material immiscible with the flowable adhesive.

14. The assembly of claim 9, wherein the substrate is selected from a group consisting of a printed circuit board, a package substrate, a card, a motherboard, and a flex substrate.

15. The assembly of claim 9, wherein the chip component is selected from a group consisting of a flip chip component, an unpackaged chip component, a packaged chip component, a processing device, a memory device, an input/output device, a graphics device, and audio device, a chipset device, a controller device, an optoelectronic device, and a network communications device.

16. The assembly of claim 12, wherein the electrical device is selected from a group consisting of a computing device, a communication device, an entertainment device, an analytical/monitoring device, a vehicle operation/safety device, a network device, and an industrial/manufacturing device.

17. The assembly of claim 12, wherein the chip component is at least one of a flip chip component or a controlled collapse chip connect (C4) component.

* * * * *